United States Patent  (10) Patent No.: US 10,716,400 B2
Jones et al. (45) Date of Patent: Jul. 21, 2020

(54) SYSTEM AND METHOD FOR HORIZONTAL LEVELING OF SERVER RACKS

(71) Applicant: DELL PRODUCTS, LP, Round Rock, TX (US)

(72) Inventors: Timothy D. Jones, Elgin, TX (US); John R. Palmer, Georgetown, TX (US); Alan J. Brumley, Leander, TX (US)

(73) Assignee: Dell Products, L.P., Round Rock, TX (US)

( * ) Notice: Subject to any disclaimer, the term of this patent is extended or adjusted under 35 U.S.C. 154(b) by 157 days.

(21) Appl. No.: 15/787,248

(22) Filed: Oct. 18, 2017

(65) Prior Publication Data

US 2019/0110597 A1 Apr. 18, 2019

(51) Int. Cl.
| | | |
|---|---|---|
| A47B 91/16 | (2006.01) | |
| A47B 91/00 | (2006.01) | |
| G01C 9/02 | (2006.01) | |
| H05K 7/14 | (2006.01) | |
| G01L 3/00 | (2006.01) | |
| H05K 7/18 | (2006.01) | |
| H05K 5/02 | (2006.01) | |
| A47B 91/02 | (2006.01) | |
| G01C 5/00 | (2006.01) | |

(52) U.S. Cl.
CPC ............ *A47B 91/16* (2013.01); *A47B 91/002* (2013.01); *G01C 9/02* (2013.01); *G01L 3/00* (2013.01); *H05K 5/0234* (2013.01); *H05K 7/1488* (2013.01); *H05K 7/18* (2013.01); *A47B 91/024* (2013.01); *G01C 5/00* (2013.01)

(58) Field of Classification Search
CPC ..... A47B 91/028; A47B 91/16; H05K 5/0234
USPC ......... 248/688, 188.8, 550, 677, 188.1, 188, 248/188.2, 188.3, 188.4
See application file for complete search history.

(56) References Cited

U.S. PATENT DOCUMENTS

| | | | | |
|---|---|---|---|---|
| 5,292,095 A * | 3/1994 | Cattaneo | ............. | A47B 91/028 248/188.4 |
| 5,735,618 A * | 4/1998 | Gluskoter | ............. | G06F 3/0208 248/188.4 |
| 5,836,556 A * | 11/1998 | Kim | ......... | F16M 7/00 248/188.4 |
| 5,890,696 A * | 4/1999 | Ozawa | .................. | A47B 91/00 248/188.4 |
| 6,407,351 B1 * | 6/2002 | Meyer | ..................... | F16M 7/00 177/238 |
| 6,461,002 B1 * | 10/2002 | Su | ......................... | F16M 11/10 248/188.4 |
| H002239 H * | 5/2010 | Campbell | ..................... | 248/688 |
| 7,717,380 B2 * | 5/2010 | Kwon | .................. | D06F 39/125 16/44 |
| 7,775,489 B2 * | 8/2010 | Facis | ...................... | A47B 91/00 248/188.2 |

(Continued)

*Primary Examiner* — Terrell L McKinnon
*Assistant Examiner* — Michael McDuffie
(74) *Attorney, Agent, or Firm* — Larson Newman, LLP

(57) ABSTRACT

A server rack includes supports connected to a bottom base, and at least one shelf connected between at least two of the supports. Adjustable feet engaging the bottom base are disposed proximate a corresponding generally corner region of the bottom base. Jack bodies protruding upwardly from the bottom base are disposed proximate the corresponding generally corner region of the bottom base.

7 Claims, 14 Drawing Sheets

(56) References Cited

U.S. PATENT DOCUMENTS

| | | | |
|---|---|---|---|
| 7,900,485 B2 * | 3/2011 | Lee | D06F 39/125 |
| | | | 248/188.8 |
| 8,579,242 B2 * | 11/2013 | Huang | F16M 11/10 |
| | | | 248/157 |
| 8,757,565 B2 * | 6/2014 | Adams | F24C 15/086 |
| | | | 248/176.3 |
| 9,179,573 B1 | 11/2015 | Lundquist et al. | |
| 2005/0116134 A1 * | 6/2005 | Lee | D06F 37/20 |
| | | | 248/650 |
| 2007/0144993 A1 | 6/2007 | Knoop | |
| 2007/0262213 A1 * | 11/2007 | de Toledo | A47L 15/4253 |
| | | | 248/188.8 |
| 2010/0237223 A1 * | 9/2010 | Kao | A47B 91/024 |
| | | | 248/688 |
| 2011/0198458 A1 * | 8/2011 | Karl | A47B 91/024 |
| | | | 248/188.4 |
| 2013/0048805 A1 * | 2/2013 | Haydu | A47B 91/028 |
| | | | 248/188.4 |
| 2013/0112822 A1 * | 5/2013 | Ishiwata | G03G 21/1619 |
| | | | 248/188.8 |
| 2014/0009745 A1 * | 1/2014 | Xu | F16M 11/046 |
| | | | 353/119 |
| 2014/0125974 A1 * | 5/2014 | Hoult | F16F 13/08 |
| | | | 356/244 |
| 2015/0146373 A1 * | 5/2015 | Deng | G06F 1/166 |
| | | | 361/679.59 |
| 2016/0338220 A1 | 11/2016 | Crawford et al. | |

* cited by examiner

Equipment Weight = (Total Weight) − (Rack Weight)

SYSTEM AND METHOD FOR HORIZONTAL LEVELING OF SERVER RACKS

FIELD OF THE DISCLOSURE

The present disclosure generally relates to information handling systems, and more particularly relates to horizontal leveling of racks storing servers and other electronic equipment.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

Electronic jacks raise or lower a corresponding corner of an equipment rack based on a tilt detected by a user's mobile device. The mobile device is laid on the equipment rack, and a software application levels the equipment rack based on sensory outputs generated by an accelerometer operating in the mobile device. Other sensory outputs may detect unsafe rack footing in response to flooring vents, flooring gaps, or other soft or crushable surface. Moreover, torques associated with the electronic jacks may be used to determine corner weights and to identify components housed within the equipment rack.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
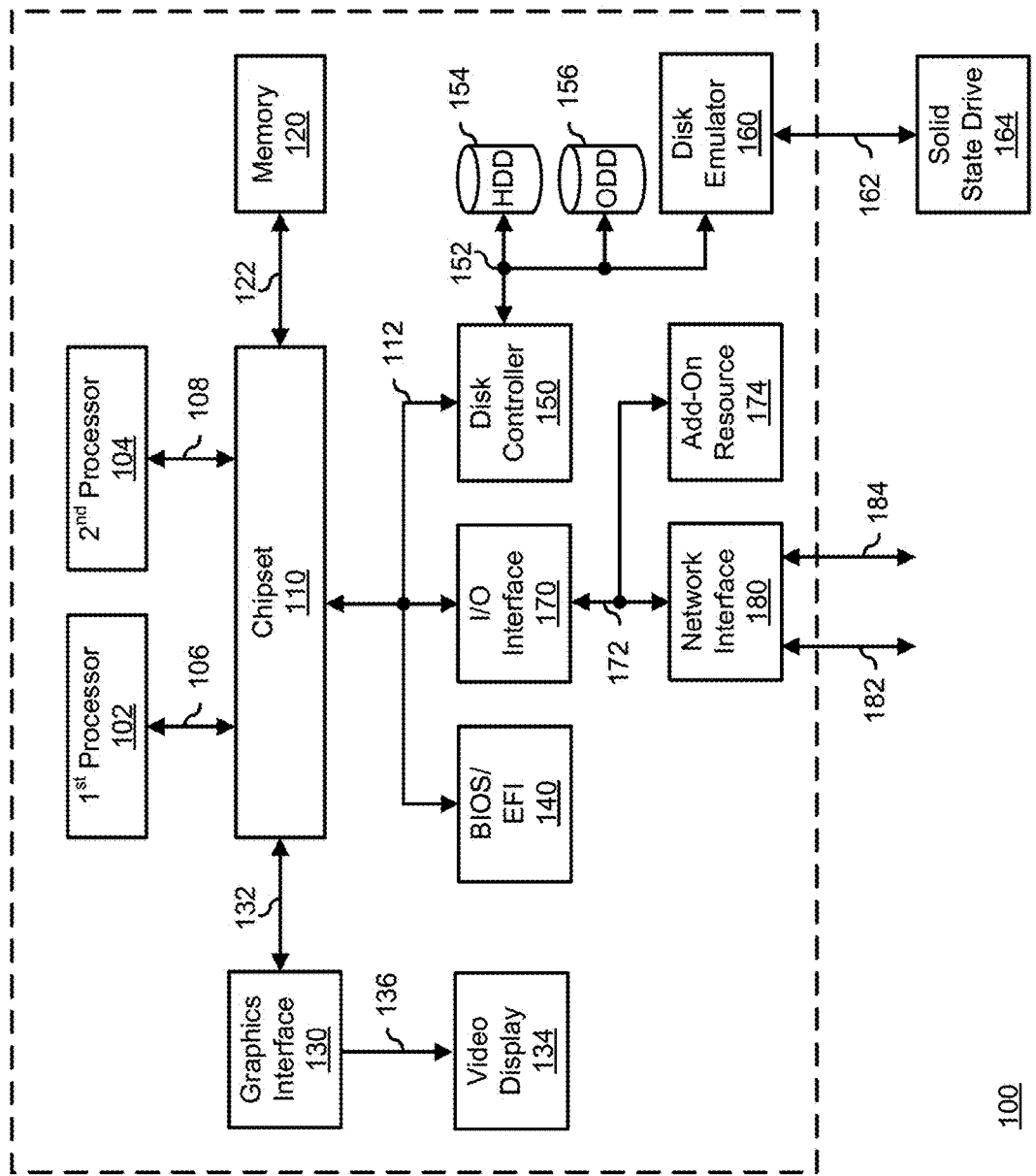
FIG. 1 is a block diagram illustrating an information handling system according to an embodiment of the present disclosure.

FIG. 1 illustrates a generalized embodiment of information handling system 100, according to exemplary embodiments. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller 150 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
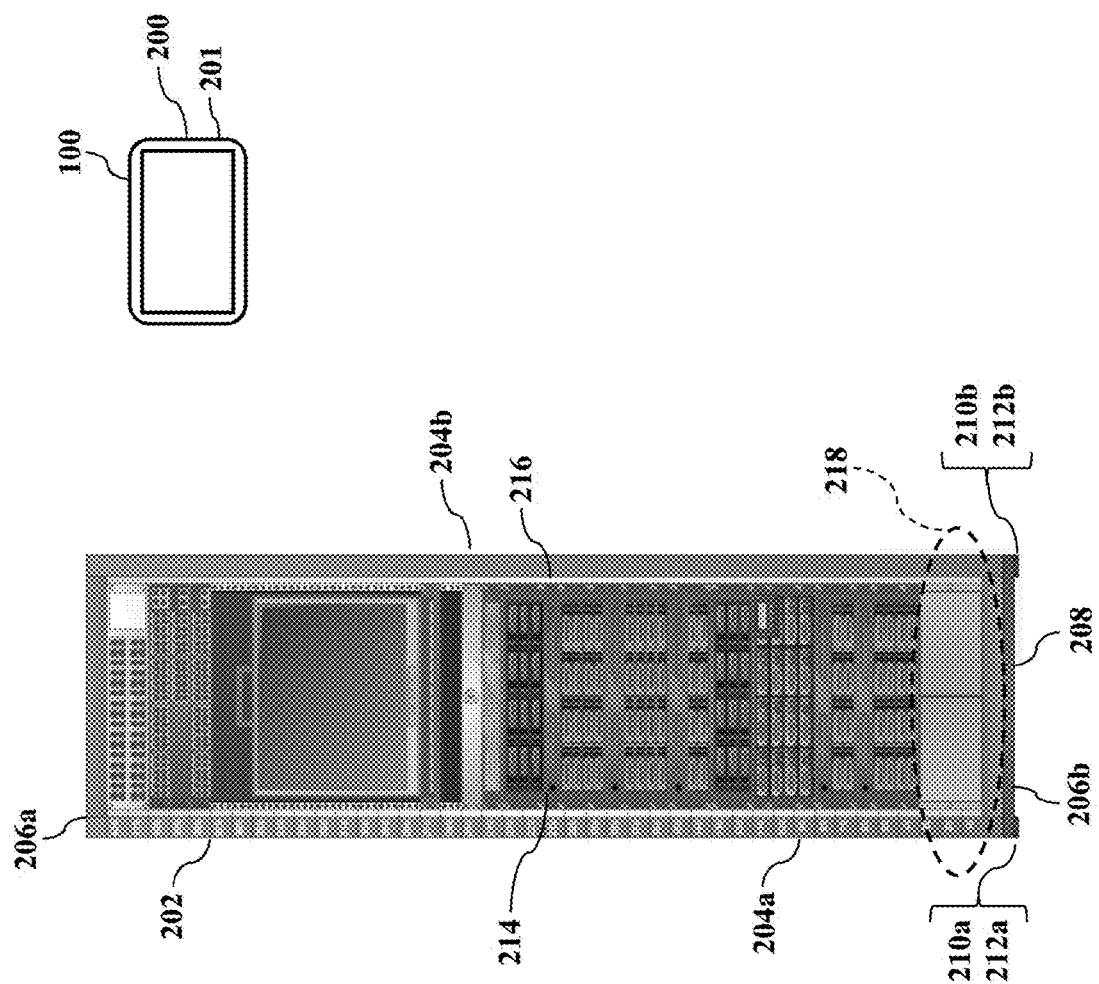
FIG. 2 is another illustration of the information handling system, according to exemplary embodiments.

FIG. 2 is another illustration of the information handling system 100, according to exemplary embodiments. While the information handling system 100 may be any processor-controlled device, here the information handling system 100 is illustrated as a mobile device 200 (such as a tablet computer 201), which most people are thought familiar. The mobile device 200 is enlarged for clarity. The mobile device 200 may be used to control leveling of an equipment rack 202. As the reader likely understands, the equipment rack 202 has a plurality of vertical supports (illustrated as reference numerals 204a-b) and horizontal supports (illustrated as reference numerals 206a-b). The equipment rack 202 may also have top and side panels (not shown for simplicity). The vertical supports 204a-b are connected to a bottom base 208 having adjustable foot 210 at one or more corner regions 212a-b. FIG. 2 is a front view, so only two (2) adjustable feet 210a-b are shown. As the reader understands, though, the base 208 may have any number (commonly four) of the adjustable feet 210 at each corresponding rear corner region 212. The equipment rack 202 may also have internal slides 214 for shelves 216. The equipment rack 202 resembles a cabinet that houses or stacks any equipment. While the equipment rack 202 may contain anything, this disclosure will mainly discuss information technology equipment. That is, the equipment rack 202 stores servers, switches, and other information technology equipment. The equipment rack 202 may have lockable front and rear doors (not shown for simplicity) for added security.

Horizontal level may be desired. As the reader likely understands, if the equipment rack 202 is not mostly or substantially level, the equipment rack 202 may lift and even tip over due to gravity. The servers, switches, and other information technology equipment will likely be damaged, and a human administrator or technician could be physically injured. The mobile device 200 may thus provide and control a leveling system 218 to ensure the equipment rack 202 is horizontally level and/or plumb with respect to gravity.

Figure 3:
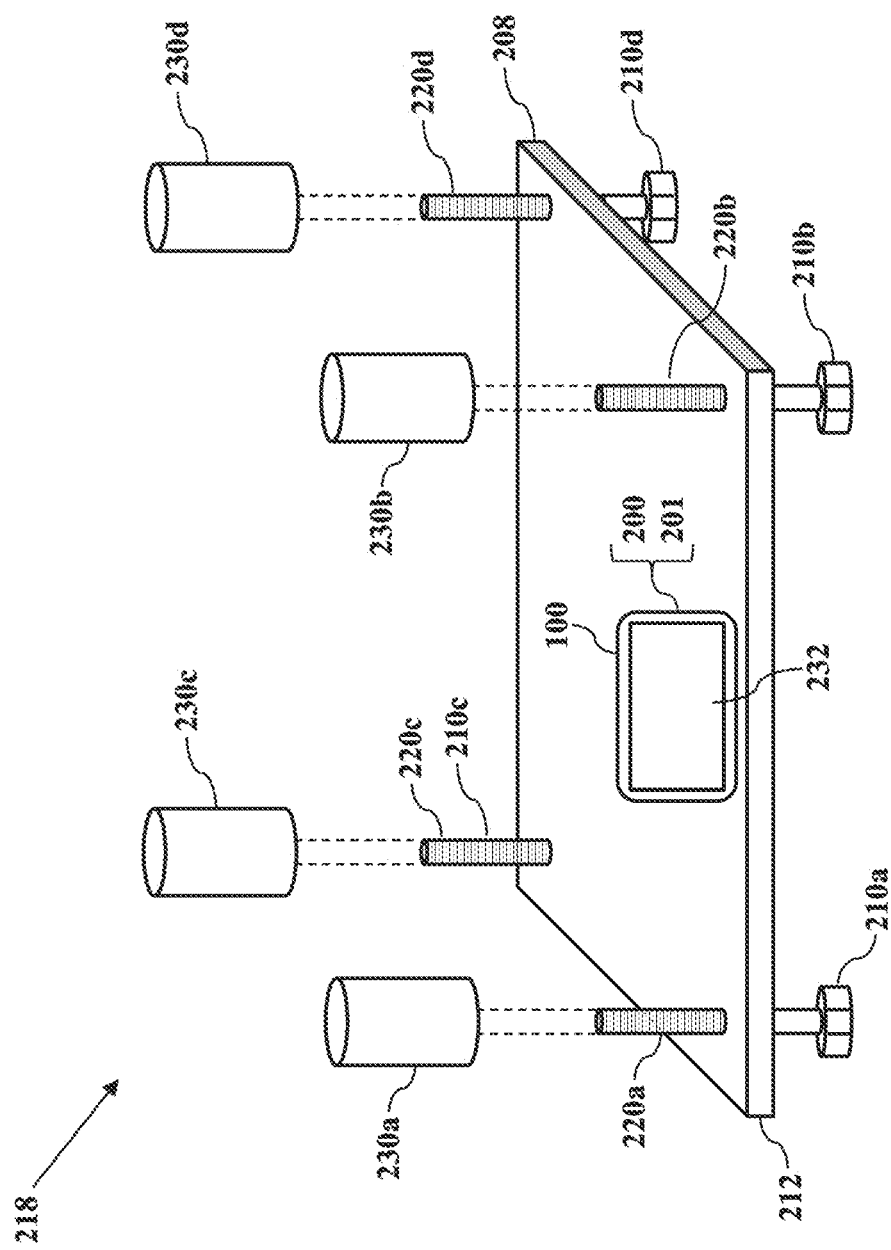
FIGS. 3-4 are simple illustrations of a leveling system, according to exemplary embodiments.

FIG. 3 is a simple illustration of the leveling system 218, according to exemplary embodiments. FIG. 3 illustrates the base 208 with the adjustable feet 210a-d. As the reader likely understands, each adjustable foot 210a-d has a corresponding threaded portion 220 that threadably engages the base 208 (perhaps by engaging a mating threaded nut, which is not shown for simplicity).

As the reader likely understands, a conventional leveling scheme is cumbersome and prone to error. A human user conventionally uses a wrench to adjust each foot 210a-d to level the base 208. The human user, in other words, must lie on a floor and maneuver the wrench to adjust each foot 210a-d. Manual leveling thus requires physical movements that some people simply cannot perform. Moreover, manual leveling requires physical access that wastes space and that reduces the number of equipment racks installed in a location (such as a server facility). Manual leveling is also subject to human error and large/wide tolerances.

Other exemplary embodiments may automate leveling. The leveling system 218 includes the mobile device 200 that interfaces with one or more electronic jacks 230. Because there are four (4) adjustable feet 210a-d, FIG. 3 illustrates four (4) corresponding electronic jacks 230a-d. Each electronic jack 230a-d simply slips over and mechanically engages its corresponding foot 210a-d. Each electronic jack 230a-d has an internal mechanism (later explained) that turns, raises, and/or lowers its corresponding foot 210a-d in response to signals or commands from the mobile device 200. The mobile device 200, for example, may use its internal sensor (such as an accelerometer 232) to sense horizontal level and/or plumb in at least two (2) axes or planes. If a technician or administrator places or lays the mobile device 200 on the base 208 (or top, or inner shelf, or any other surface of the equipment rack 202 illustrated in FIG. 2), the mobile device 200 may individually instruct each electronic jack 230 to activate, thus bearing against the base 208 to raise or lower the corresponding adjustable foot 210 (and the bottom corner region 212 illustrated in FIG. 2). The mobile device 200 activates each electronic jack 230 to level the base 208 (and thus the equipment rack 202 illustrated in FIG. 2) in response to sensory outputs generated by the accelerometer 232. Exemplary embodiments may thus quickly and automatically level the equipment rack 202 with little or no human effort.

Exemplary embodiments reduce, or even eliminate, human effort. Because the electronic jacks 230 may be installed at each corner 212 of the equipment rack 202, a human user need not sprawl on the floor for access. The mobile device 200 interfaces with the electronic jacks 230, perhaps via a data cable/wire and/or a wireless communications network (such as Bluetooth® or Wi-Fi®), to command the electronic jacks 230 to level the equipment rack 202 in response to sensory outputs generated by the accelerometer 232. The electronic jacks 230 may be pre-assembled or pre-installed in the equipment rack 202. The electronic jacks 230, however, may also be separately obtained or purchased and installed or retrofitted into the equipment rack 202. Regardless, exemplary embodiments quickly and automatically level the equipment rack 202 with little or no human effort.

Figure 4:
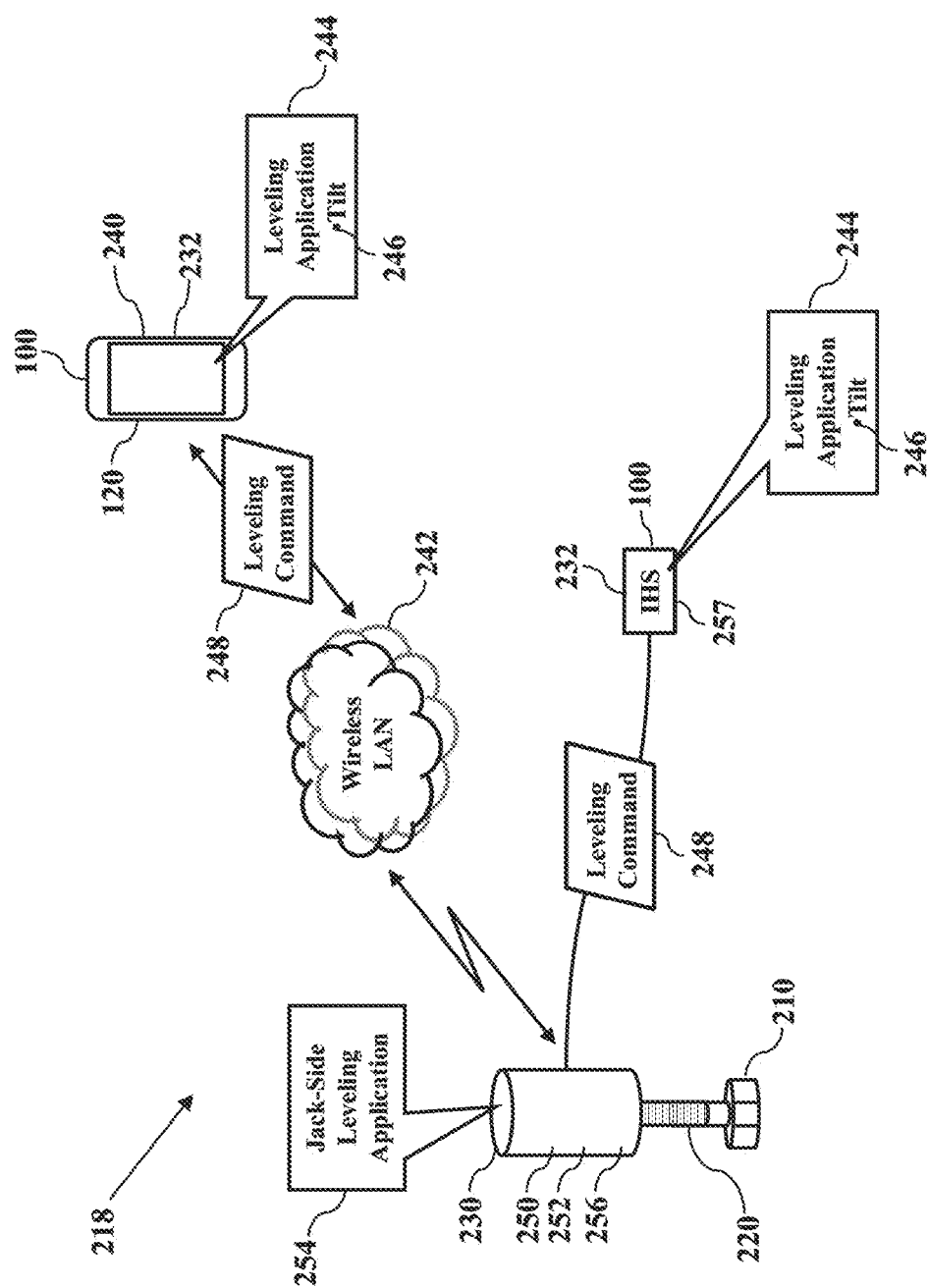

FIG. 4 is another simplified illustration of the leveling system 218, according to exemplary embodiments. Here the information handling system 100 (e.g., the mobile device 200) is illustrated as a smartphone 240, which most people are thought familiar. The smartphone 240 communicates with the electronic jack 230 via a communications network 242. FIG. 4 illustrates the communications network 242 as a wireless local area network (LAN), but exemplary embodiments may additionally or alternatively utilize a wide area network (such as a cellular network). The smartphone 240 and the electronic jack 230 may each have a network address. The smartphone 240 executes a leveling application 244 stored in its memory 120. The leveling application 244 uses one or more sensory outputs generated by the accelerometer 232 to determine or infer a one-, two-, or three-dimensional tilt 246 associated with the smartphone 240 in relation to gravity. The leveling application 244 may then translate the sensory outputs into a leveling command 248 that is sent via the communications network 242 to the electronic jack 230.

The electronic jack 230 includes a leveling mechanism 250. The electronic jack 230 hydraulically and/or mechanically engages its corresponding adjustable foot 210. The electronic jack 230 may be merely a remotely controlled motor that responds to, and/or executes, the leveling command 248. The electronic jack 230 may optionally be a smart component having an internal processor 252 that executes a jack-side leveling application 254 stored in a memory device 256. The jack-side leveling application 254 cooperates with the leveling application 244 to execute the leveling command 248 sent via the communications network 242 from the smartphone 240. Regardless, the electronic jack 230 thus raises or lowers its corresponding adjustable foot 210, based on the sensory outputs generated by the accelerometer 232 operating in the smartphone 240. The technician/administrator/user need only lay the smartphone 240 on the equipment rack 202 and open, start, or initialize the leveling application 244. The smartphone 240 establishes communication with the electronic jack 230 and commands the electronic jack 230 to activate, thus raising or lowering the corresponding adjustable foot 210 (and bottom corner 212 illustrated in FIG. 2). The equipment rack 202 is quickly and automatically leveled with little or no human effort.

FIG. 4 also illustrates an alternative embodiment. The information handling system 100 may optionally be a general purpose or special purpose computer 257 with a wired connection to the electronic jack 230. A data cable 258, for example, may provide wired communication between the electronic jack 230 and the computer 257. The computer 257 also executes the leveling application 244 based on the one or more sensory outputs generated by the accelerometer 232 to determine or infer a one-, two-, or three-dimensional tilt 246 in relation to gravity. The leveling application 244 may then translate the sensory outputs into the leveling command 248 that is sent via the data cable 258 to the electronic jack 230.

Exemplary embodiments may be applied regardless of networking environment. Exemplary embodiments may be easily adapted to stationary or mobile devices having cellular, wireless fidelity (Wi-Fi®), near field, and/or Bluetooth® capability. Exemplary embodiments may be applied to mobile devices utilizing any portion of the electromagnetic spectrum and any signaling standard (such as the IEEE 802 family of standards, GSM/CDMA/TDMA or any cellular standard, and/or the ISM band). Exemplary embodiments, however, may be applied to any processor-controlled device operating in the radio-frequency domain and/or the Internet Protocol (IP) domain. Exemplary embodiments may be applied to any processor-controlled device utilizing a distributed computing network, such as the Internet, an intranet, LAN, and/or a wide-area network (WAN). Exemplary embodiments may be applied to any processor-controlled device utilizing power line technologies, in which signals are communicated via electrical wiring. Indeed, exemplary embodiments may be applied regardless of physical componentry, physical configuration, or communications standard(s).

Exemplary embodiments may utilize any processing component, configuration, or system. Any processor could be multiple processors, which could include distributed processors or parallel processors in a single machine or multiple machines. The processor can be used in supporting a virtual processing environment. The processor could include a state machine, application specific integrated circuit (ASIC), programmable gate array (PGA) including a Field PGA, or state machine. When any of the processors execute instructions to perform "operations," this could include the processor performing the operations directly and/or facilitating, directing, or cooperating with another device or component to perform the operations.

Figure 5:
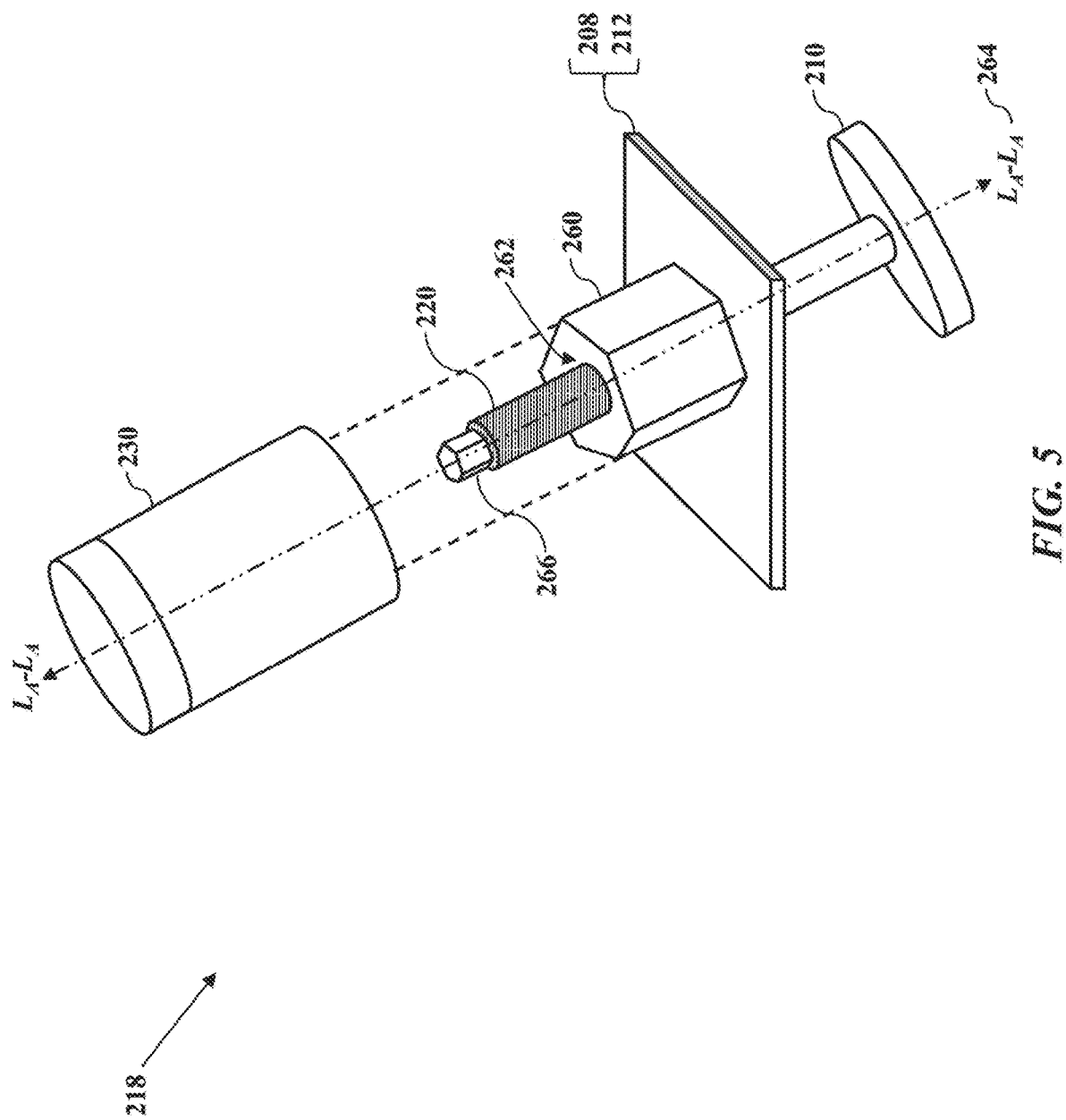
FIGS. 5-7 further illustrate the leveling system, according to exemplary embodiments.
Figure 6:
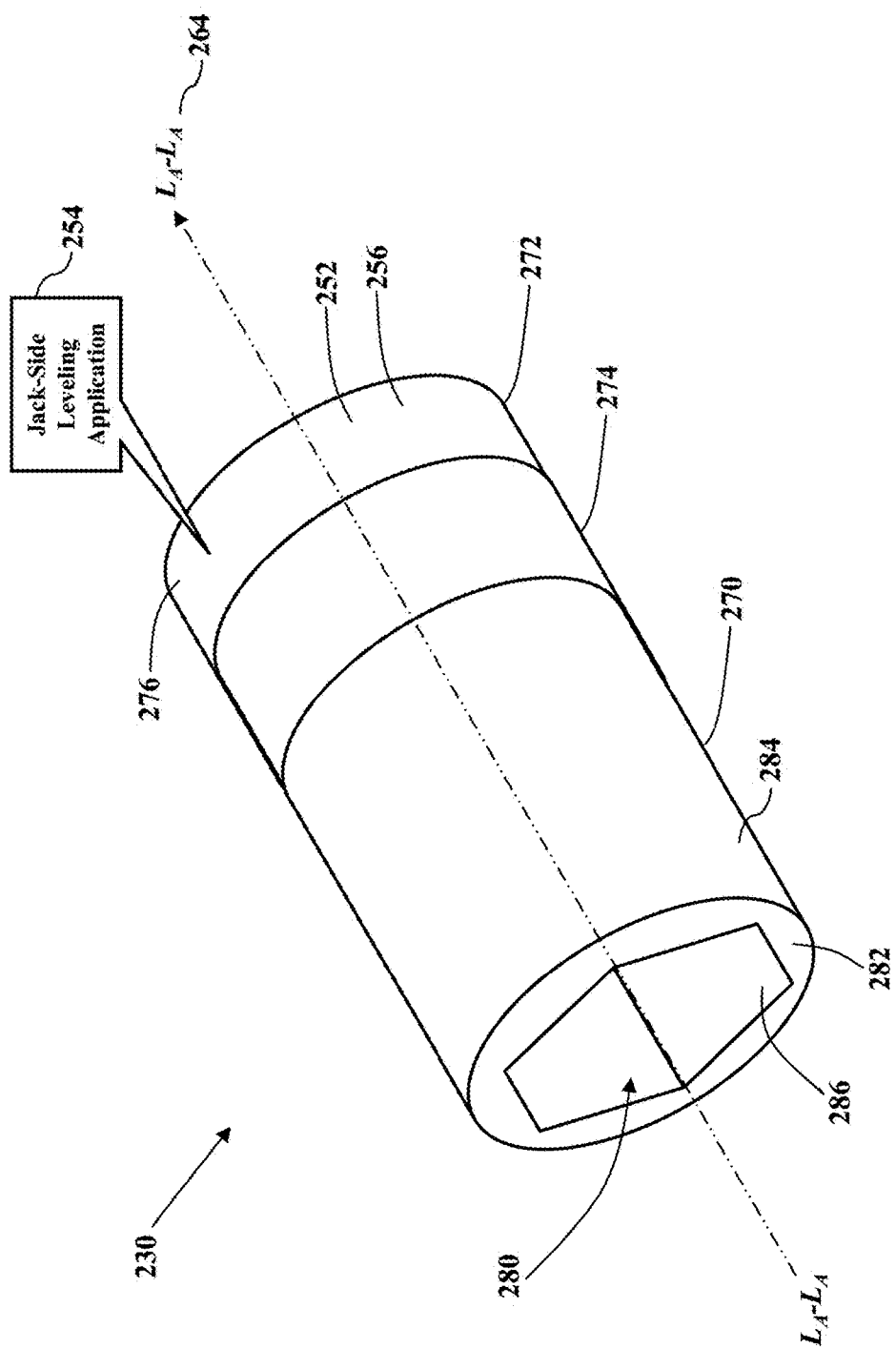
Figure 7:
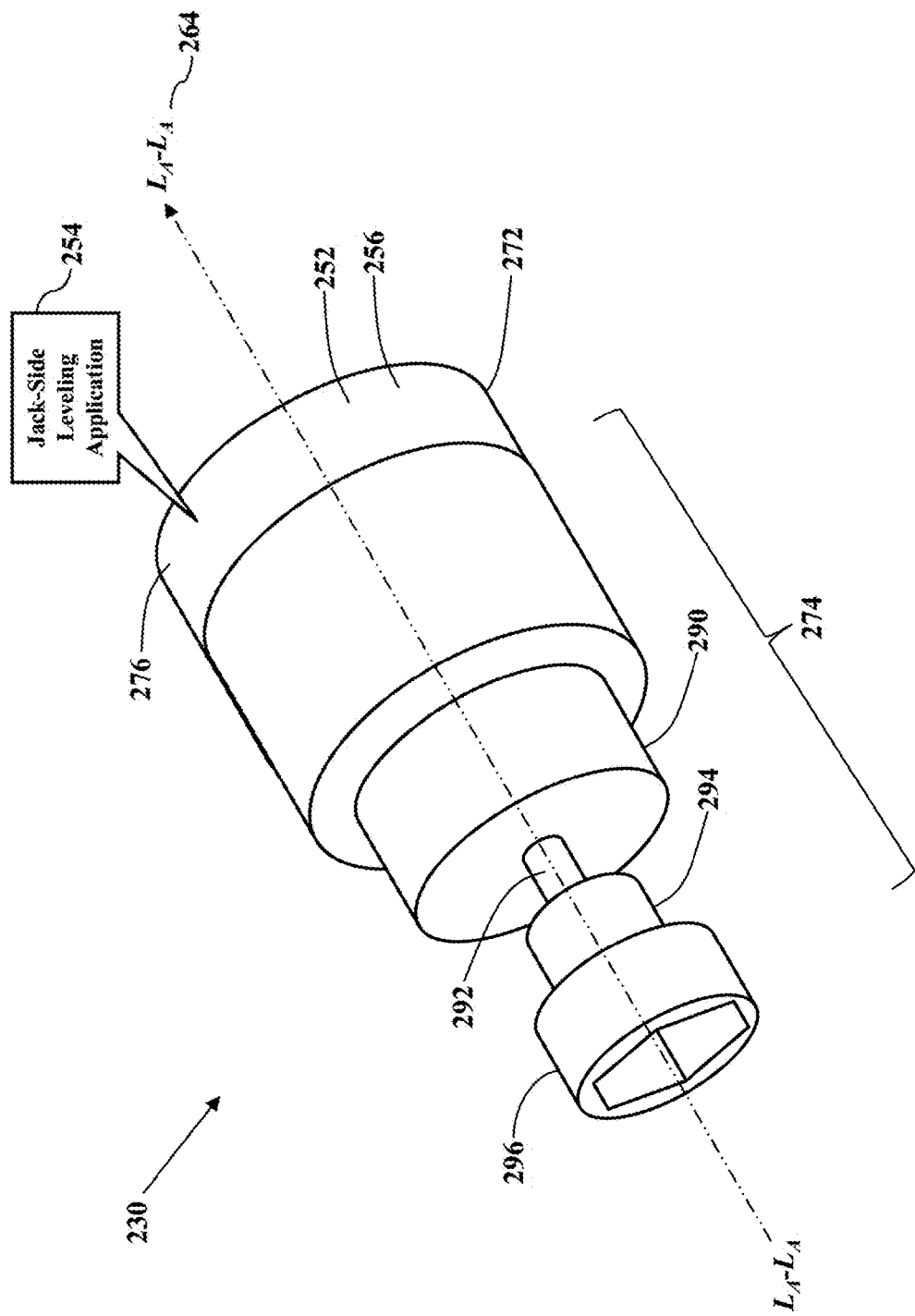

FIGS. 5-7 further illustrate the leveling system 218, according to exemplary embodiments. Here the electronic jack 230 may slide onto, or slip over, a jack body 260 formed in the bottom base 208 of the equipment rack 202 (illustrated in FIG. 2). While the jack body 260 may be constructed using any technique, the inventors envision that the jack body 260 is most economically extruded, pressed, or molded into the base 208, proximate the bottom corner 212. The jack body 260 (upwardly or downwardly) protrudes from the base 208. The jack body 260 has a central opening, aperture, bore, or passage 262 about a longitudinal axis $L_A$-$L_A$ (illustrated as reference numeral 264) that exposes the threaded portion 220 of the adjustable foot 210. When the electronic jack 230 is installed onto the jack body 260, the electronic jack 230 has an internal feature (not shown for simplicity) that aligns with a faceted tip 266 of the adjustable foot 210, thus allowing the electronic jack 230 to mechanically engage and drive the adjustable foot 210. The electronic jack 230 turns or rotates the threaded portion 220 of the adjustable foot 210, in response to the leveling command 248 sent by the smartphone 240 (as illustrated with reference to FIG. 4). As the electronic jack 230 spins the threaded portion 220 of the adjustable foot 210, the adjustable foot 210 bears against the base 208 and/or a flooring surface, thus raising or lowering the bottom corner 212 of the equipment rack 202.

FIG. 6 illustrates more details of the electronic jack 230. The electronic jack 230 has an outer case 270, an electronics module 272, and a motor and gearbox assembly 274. The outer case 270 slides onto, or slips over, the jack body 260 formed in the base 208 of the equipment rack 202 (as FIG. 5 illustrated). The electronics module 272 may house or contain the internal processor 252 that executes the jack-side leveling application 254 stored in the memory device 256. The electronics module 272 also includes a network interface 276 to the communications network 242, thus allowing the electronic jack 230 to communicate with the smartphone 240 (illustrated in FIG. 4). The network interface 276 is preferably wireless (such as Bluetooth®, Wi-Fi®, and/or cellular), but a wired connection may be used if desired. The electronics module 272 thus activates the motor and gearbox assembly 274 in response to the leveling command 248 sent by the smartphone 240 (again illustrated in FIG. 4).

The electronic jack 230 also has an internal socket 280. The internal socket 280 is formed, machined, or molded in the outer case 270. While the internal socket 280 may have any size and shape, FIG. 6 illustrates a multi-faceted, hexagonal cross-section about the longitudinal axis $L_A$-$L_A$ 264 having a radius/diameter and depth to mate in a male/female relationship with the jack body 260 formed in the base 208 of the equipment rack 202 (as FIG. 5 best illustrates). The outer case 272 thus has a material thickness 282 separating an outer surface 284 from an inner surface 286 of the internal socket 280.

FIG. 7 illustrates internal features. Here the outer case (illustrated as reference numeral 270 in FIG. 6) has been removed to reveal the internal components of the motor and gearbox assembly 274. An electric motor 290 receives electrical power from a power source (such as an internal battery, an electrical connection to an electrical grid, and/or a power-over-Ethernet connection to the information technology housed in the equipment rack 202). The electrical power causes the electronic motor 290 to spin an output shaft 292 that engages and turns a gearbox 294. The gearbox 294 is mechanically coupled to a drive socket 296. When the electronic jack 230 is slipped over the jack body 260 (as FIG. 5 illustrates), the internal drive socket 296 is designed to align with and engage the faceted tip 266 of the adjustable foot 210 (as FIG. 5 illustrates). FIG. 7 thus illustrates the drive socket 296 having a hexagonal cross-section about the longitudinal axis $L_A$-$L_A$ 264 with a radius/diameter and depth to mate in a male/female relationship with the faceted tip 266 of the adjustable foot 210. The drive socket 296 thus has a material thickness separating an outer surface from an inner surface (not shown for simplicity). When the smartphone 240 commands the electronic jack 230 to rotationally spin (whether clockwise or counterclockwise), the electric motor 290 turns the gearbox 294 and the drive socket 296, thus spinning the threaded portion 220 of the adjustable foot 210.

Exemplary embodiments may thus include counter-rotational features. As the electronic jack 230 spins the adjustable foot 210, exemplary embodiments may provide a counter-torque and/or a counter-rotational feature. The jack body 260, for example, may have an outer shape (such as the hexagonal shape illustrated in FIG. 5) that reduces, or even prevents, the electronic jack 230 from slipping during spin leveling. While the jack body 260 may have any cross-sectional outer shape, FIG. 5 illustrates a multi-faceted, hexagonal outer shape having six (6) bearing surfaces. The hexagonal outer shape provides a compromise between torque transmission (applied by the electronic jack 230) and ease of slip-fit. The hexagonal outer shape, in other words, provides adequate counter-torque and/or counter-rotation and also provides six (6) distinct installation orientations (at 60 degrees each). The internal socket 280 in the electronic jack 230 may, likewise, have a hexagonal inner surface 286 and depth that mates in a male/female relationship with the jack body 260 formed in the base 208 of the equipment rack 202 (as FIGS. 5-6 best illustrate). As the electronic jack 230 spins the adjustable foot 210, the hexagonally-shaped jack body 260 and the internal socket 280 have an outer structure, shape, and/or strength to provide a counter-torque and/or counter-rotation.

Figure 8:
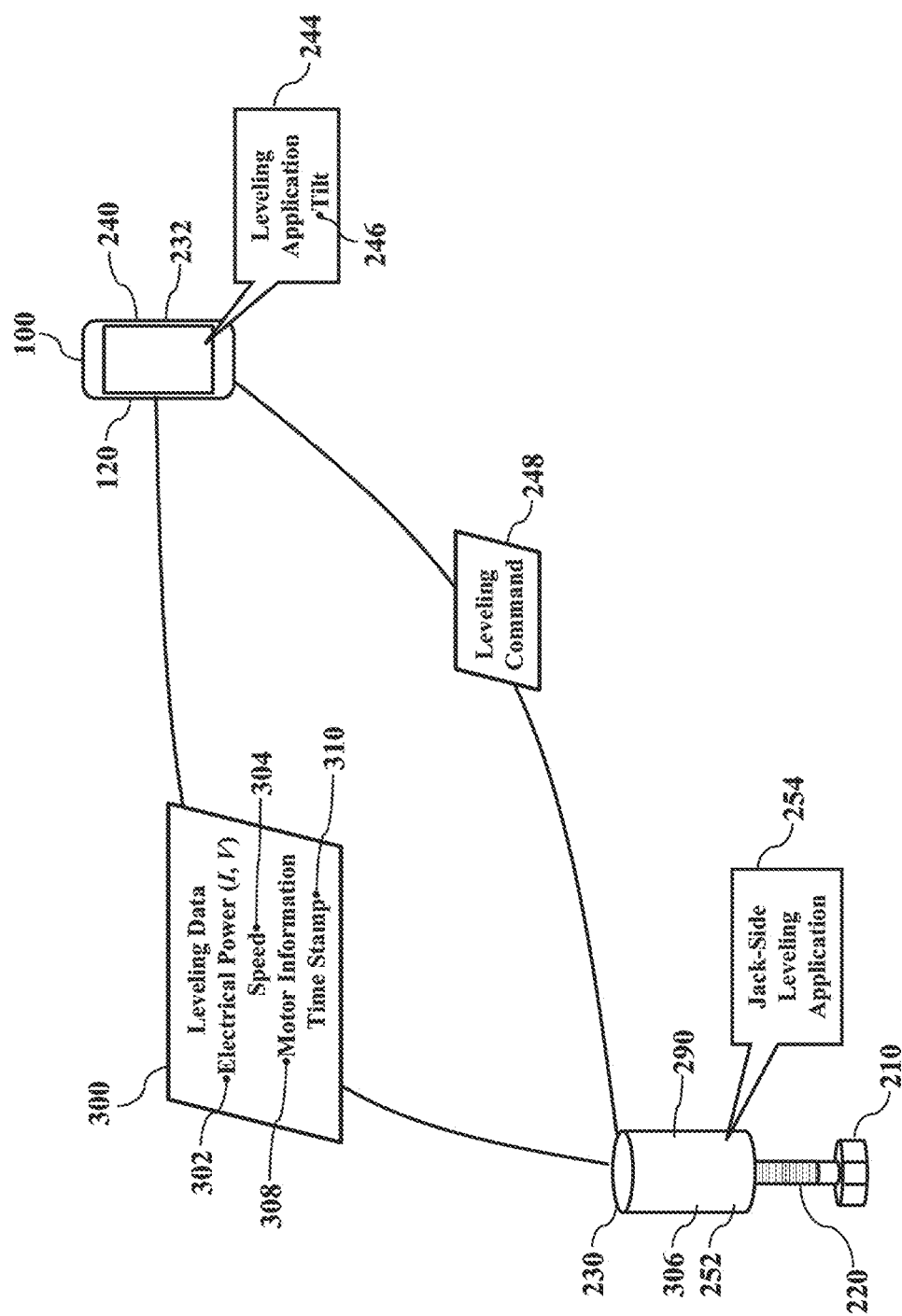
FIG. 8 illustrates a feedback mechanism, according to exemplary embodiments.

FIG. 8 illustrates a feedback mechanism, according to exemplary embodiments. Here the electronic jack 230 may send leveling data 300 to the information handling system 100 (again illustrated as the smartphone 240). The smartphone 240 may then use the leveling data 300 to refine or augment the leveling command 248. The leveling data 300 thus provides a feedback mechanism for additional options and features for determining the tilt 246 (which this disclosure later discusses) and leveling the equipment rack 202 (illustrated in FIG. 2).

The leveling data 300 may be comprehensive. The leveling data 300, for example, may represent information describing an electrical power 302 (e.g., current and/or voltage) consumed by the electric motor 290 when turning its corresponding adjustable foot 210. The leveling data 300 may additionally or alternatively represent information describing a rotational speed 304 (such as revolutions per minute or second) of the electric motor 290 when turning the adjustable foot 210. The rotational speed 304 may be determined by a speed sensor 306 that measures the rotational speed 304 of the electric motor 290 and/or the adjustable foot 210. The leveling data 300 may further include motor information 308 describing the electric motor 290, such as a manufacturer, model, efficiency, gear ratios for the gearbox 294 (illustrated in FIG. 7), and any other parameters associated with the electronic jack 230. The leveling data 300 may also include a time stamp 310 describing a date/time of sensory capture (perhaps by the speed sensor 306 and/or the processor 252) and/or the date/time of transmission. Whatever the leveling data 300, the electronic jack 230 may periodically or randomly report the leveling data 300 to the smartphone 240 (such as every 0.5 second or any other timing period).

Figure 9:
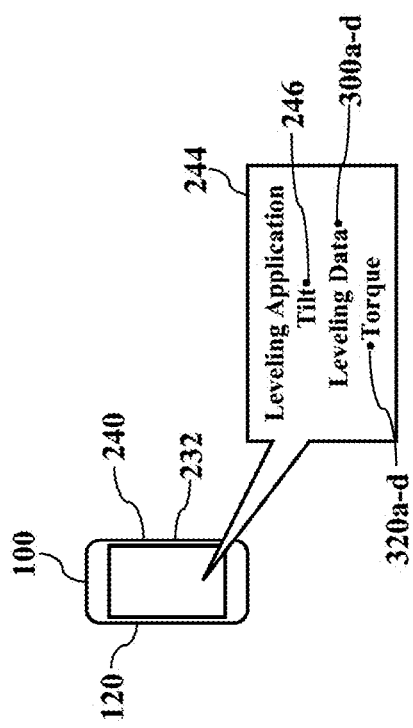
FIG. 9 illustrates calculations of a torque, according to exemplary embodiments.

FIG. 9 illustrates calculations of a torque 320, according to exemplary embodiments. Because the equipment rack 202 likely has at least four (4) adjustable feet 210*a-d* and their corresponding electronic jacks 230*a-d* (as FIG. 3 illustrates), the smartphone 240 may receive four (d) different wireless transmissions of the leveling data 300*a-d* (corresponding to each electronic jack 230*a-d*). The leveling application 244 may then use each leveling data 300*a-d* to determine the corresponding turning force or the torque 320*a-d* associated with each electronic jack 230*a-d*. While exemplary embodiments may use any method and/or technique to calculate the torque 320, the leveling application 244 may simply use the following formula:

$$\tau = \frac{I \times V \times E \times 60}{2\pi(rpm)} \text{ Newton meters } (Nm),$$

where I and V are, respectively, the current and voltage of the electrical power 302 sent by the corresponding electronic jack 230*a-d* and rpm is the rotational speed 304. The leveling data 300*a-d*, in simple words, allows exemplary embodiments to determine the corresponding torque 320*a-d* associated with each electronic jack 230*a-d*. The leveling application 244 may then use each torque 320*a-d* as the feedback mechanism to level the equipment rack 202.

Figure 10:
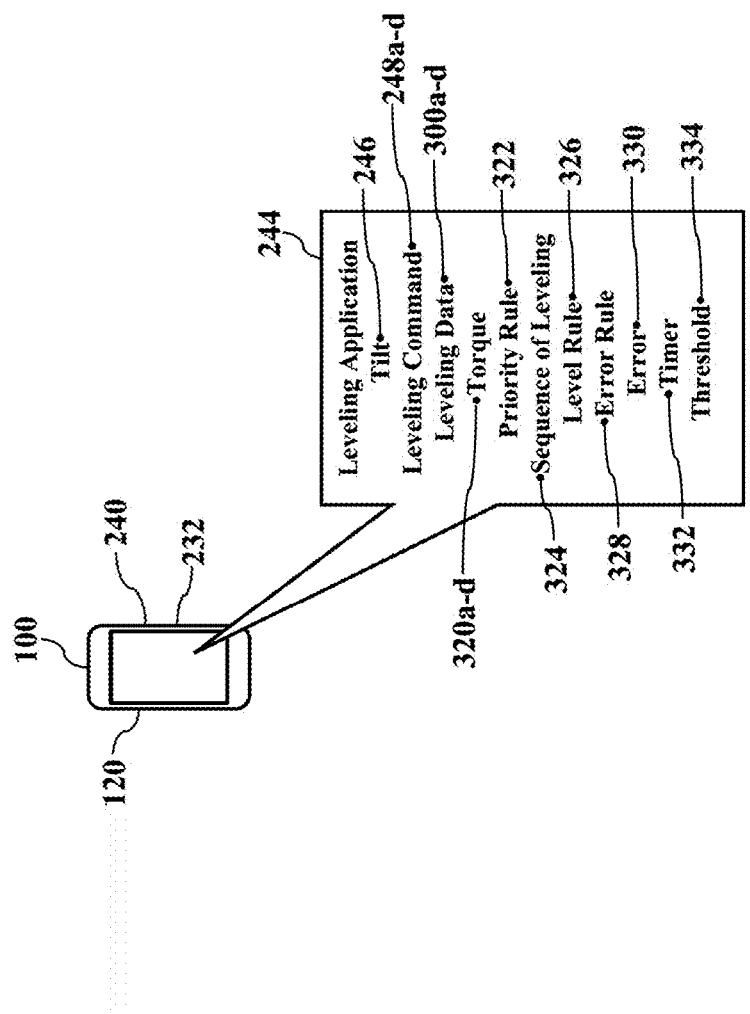
FIG. 10 illustrates various logical rules, according to exemplary embodiments.

FIG. 10 illustrates various logical rules, according to exemplary embodiments. Here exemplary embodiments may use the values of the torques 320*a-d* at each corresponding corner 212*a-d* to make inferences. For example, the torque 320 at any corner 212 may correlate to the corresponding corner load. A higher value of the torque 320 may indicate that the corresponding corner 212 has a higher weight/load. Indeed, the electric motor 290 (illustrated in FIG. 7) produces its maximum torque 320 at maximum load. The equipment rack 202, in other words, may be tilting or listing at the corner 212 experiencing the higher value of the torque 320. Conversely, a lower value of the torque 320 may indicate that the corresponding corner 212 has a lower weight/load. The equipment rack 202 may be rocking under load, with perhaps an adjustable foot 210 not contacting earth/or floor. The four (4) torques 320*a-d* may thus be compared to determine which corresponding corner 212*a-d* should be prioritized for raising or lowering. The leveling application 244 may thus have a priority rule 322 that numerically ranks the torques 320*a-d* to determine a sequence 324 of leveling. The priority rule 322, for example, may specify that the electronic jack 230 associated with the highest/greatest numerical value of the torque 320 may have a highest or first priority of activation. The "leading" electronic jack 230, in other words, may be first driven to begin leveling the corner 212 having the highest load, according to a position assignment in the numerical ranking of the torques 320*a-d*. The leveling application 244 may then drive or activate that "leading" electronic jack 230 until its corresponding torque 320 is approximately equal to another torque 320 associated with another corner 212. The leveling application 244 may even simultaneously drive or activate (forward or reverse, up or down) multiple electronic jacks 230 until some or all of the corresponding torques 320 are approximately equal in value. Similarly, the electronic jack 230 associated with the lowest/smallest numerical value of the torque 320 may have a lowest or last priority of activation. The "lagging" electronic jack 230, in other words, may have last or even no priority. Regardless, once all the individual torques 320 a-d are approximately equal in value, the priority rule 322 may be satisfied.

A level rule 326 may also be executed. If the torques 320-*d* are approximately equal in value, the leveling application 244 may be programmed to assume the four (4) corners 212 are approximately equally loaded in weight. The level rule 326 may thus cause or instruct the leveling application 244 to simultaneously drive or activate all the electronic jacks 230 until the equipment rack 202 is level (again perhaps based on the sensory outputs generated by the accelerometer 232 in the smartphone 240).

An error rule 328 may also be executed. Here some values of the torque 320 may indicate a problem with leveling. For example, if any electronic jack 230 is driven without a change in the torque 320 over time, then an error 330 may be inferred. That is, when the leveling application 244 sends the leveling command 248 to the network address associated with the electronic jack 230, exemplary embodiments may start or initialize a timer 332. The timer 332 increments up or down from an initial value to a final value. As the timer 332 counts, the leveling application 244 may also be periodically or randomly receiving the leveling data 300 reported by the electronic jack 230. The leveling application 244 may compare successive values of the torques 320 reported over time as the timer 332 counts toward its final value. The successive values of the torques 320 (collected over time) may be compared to one another. If any two or more of the successive values of the torques 320 fail to change (perhaps according to a differential threshold 334) over time, then the error rule 328 may cause the leveling application 244 to flag or denote the error 330. If the torque 320 fails to at least minimally change over time, then the corresponding corner 212 may not be raising or lowering and the corresponding corner weight is unchanging. Similarly, if the successive values of the torques 320 fail to change when the timer 332 reaches its final value, then the leveling application 244 may generate the error 330. The leveling application 244 may further generate an electronic error message (such as a short messaging service text message) that is sent via the communications network 242 to one or more notification addresses.

A common example further explains the error rule 328. Suppose, for example, that the adjustable foot 210 is inadvertently placed or positioned over a floor vent. As the reader may understand, the floor vent is not designed to be a load bearing surface. If the electronic jack 230 is driven to extend the adjustable foot 210, the floor vent will likely deform under load. As the electronic jack 230 is driven, its corresponding torques 320 may not measure up nor change over time, thus triggering the error rule 328. The leveling application 244 generates and sends the electronic error message, thus alerting personnel to the error 330 and to the deformed floor vent.

Another common example further explains the error rule 328. Suppose the adjustable foot 210 is inadvertently placed or positioned on a cracked floor tile. Again, as the reader may understand, many server facilities have a false tile floor that is raised above an actual concrete floor. Cooling ducts, electrical lines, and data lines are routed between the false tile floor and the concrete floor. If the adjustable foot 210 is inadvertently placed over the cracked floor tile, the electronic jack 230 will drive the adjustable foot 210 onto and perhaps through the cracked floor tile and into the ducts and lines. Again, as the electronic jack 230 is driven, its corresponding torques 320 may not favorably compare nor change over time, thus triggering the error rule 328. The leveling application 244 generates and sends the electronic error message, thus alerting personnel to the error 330 and to the cracked floor tile.

Positions may be monitored. Exemplary embodiments may nearly fully extend, or nearly fully withdraw, the adjustable foot 210 for predictive analysis. For example, the electronic jack 230 may have a position sensor that generates an output signal. The position sensor generates the output signal in relation to a position associated with the adjustable foot 210. The output signal has an initial value that is associated with an initial or baseline position or zero/lowest height. The output signal has a final or greatest value that is associated with a maximum threaded extension of the adjustable foot 210. The position sensor may even count rotations as the adjustable foot 210 is driven or threaded clockwise or counterclockwise. Exemplary embodiments may thus command the electronic jack 230 to raise or withdraw the adjustable foot 210 to any linear and/or rotational position or height. For example, the position sensor may increment or count in predetermined angular steps or degrees of rotation while monitoring the corresponding torque 320 associated with the electronic jack 230 (as earlier paragraphs explained). The leveling application 244 may then use each position and torque 320a-d as the feedback mechanism to level the equipment rack 202.

Leveling issues may be predicted. Because the adjustable foot 210 may be automatically raised and lowered, the positions and torques 320 may reveal potential leveling problems. Suppose, for example, any adjustable foot 210 is fully withdrawn to its initial position. As the adjustable foot 210 is then driven during extension, exemplary embodiments may count the number N of angular steps or degrees of rotation before the torque 320 indicates a resistive force or load is encountered. Exemplary embodiments, in other words, may monitor and compare the leveling data 300 associated with each electronic jack 230. If the leveling data 300 indicates that one electronic jack 230 is experiencing different values that the other electronic jacks 230, then exemplary embodiments may trigger the error rule 328. Again, one of the adjustable feet 210 may be bearing down or stepping on debris or a data cable while the other three the adjustable foot 210 have less values of the leveling data 300. A visual prompt may thus be generated and displayed that prompts the user to inspect the equipment rack 202 (or even a specific one of the adjustable feet 210). Exemplary embodiments may thus predict when a data cable is being squished or a floor issue presents a safety concern.

FIGS. 11-14 illustrate weights, according to exemplary embodiments. Here exemplary embodiments may calculate a total weight 340 of the equipment rack 202, based on the torques 320a-d reported by the electronic jacks 230a-d. That is, the leveling application 244 may infer the entire or total weight 340 of the equipment rack 202, including the equipment housed or contained within the equipment rack 202. Suppose, for simplicity, that the level rule 326 is being executed and the torques 320-d are approximately equal in value (perhaps within a level threshold). The leveling application 244 may infer the total weight 340 based on the torques 320a-d reported by the electronic jacks 230.

Figure 11:
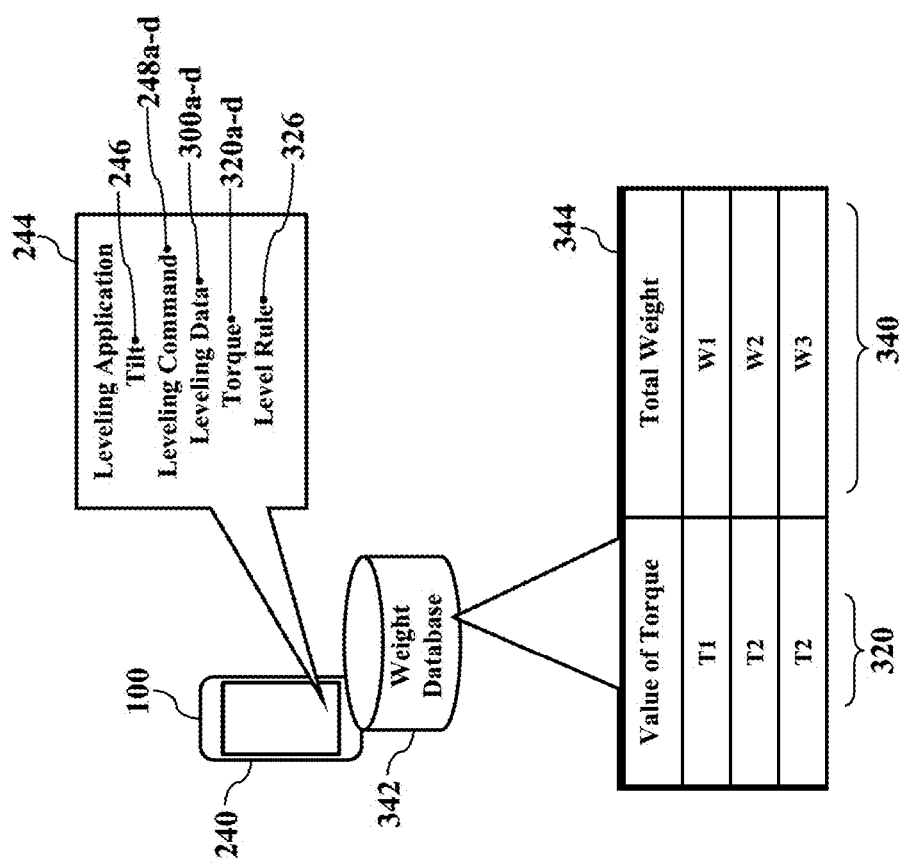
FIGS. 11-14 illustrate weights, according to exemplary embodiments.

An electronic weight database 342 may be consulted. Once the torques 320a-d are received, the leveling application 244 causes the smartphone 240 to query the electronic weight database 342 for the torques 320a-d reported by the electronic jacks 230. FIG. 11 illustrates the electronic weight database 342 being locally stored in the smartphone 240, but some or all of the database entries may be remotely stored or located at any devices accessible via the network 242 (illustrated in FIG. 4). Regardless, the electronic weight database 342 stores or contains entries that electronically associate different values of the torque 320 to their corresponding weights 342. FIG. 11 thus illustrates the electronic weight database 342 as a data table 344 that maps or relates different torques 320 to their possible corner weights 340. The electronic weight database 342 may thus be pre-populated or configured with the weights 340 that correspond to torque values 320. The leveling application 244 queries for the torque 320a-d reported by the corresponding electronic jack 230a-d and reads, identifies or determines the corresponding weight 340a-d associated with each corner 212a-d. The leveling application 244 may even retrieve the corresponding weight 340a-d, if needed or desired for other operations or calculations.

The total weight 340 is now known. Once the individual weight 340a-d associated with each corner 212a-d is identified and/or retrieved, the leveling application 244 may determine or calculate the total weight 340 by summing the corner weights 340a-d associated with each torque 320a-d. The leveling application 244 may additionally or alternatively multiply any of the weights 340a-d by the number of electronic jacks 230 reporting the torques 320. Because this disclosure assumes that the torques 320-d are approximately equal in value (according to the level rule 326), the leveling application 244 may optionally multiply the weight 340 (reported by a single electronic jack 230) by the number of electronic jacks 230 installed in the equipment rack 202. Regardless, the total weight 340 may represent the total weight of the equipment rack 202 plus the equipment housed or contained within the equipment rack 202.

Figure 12:
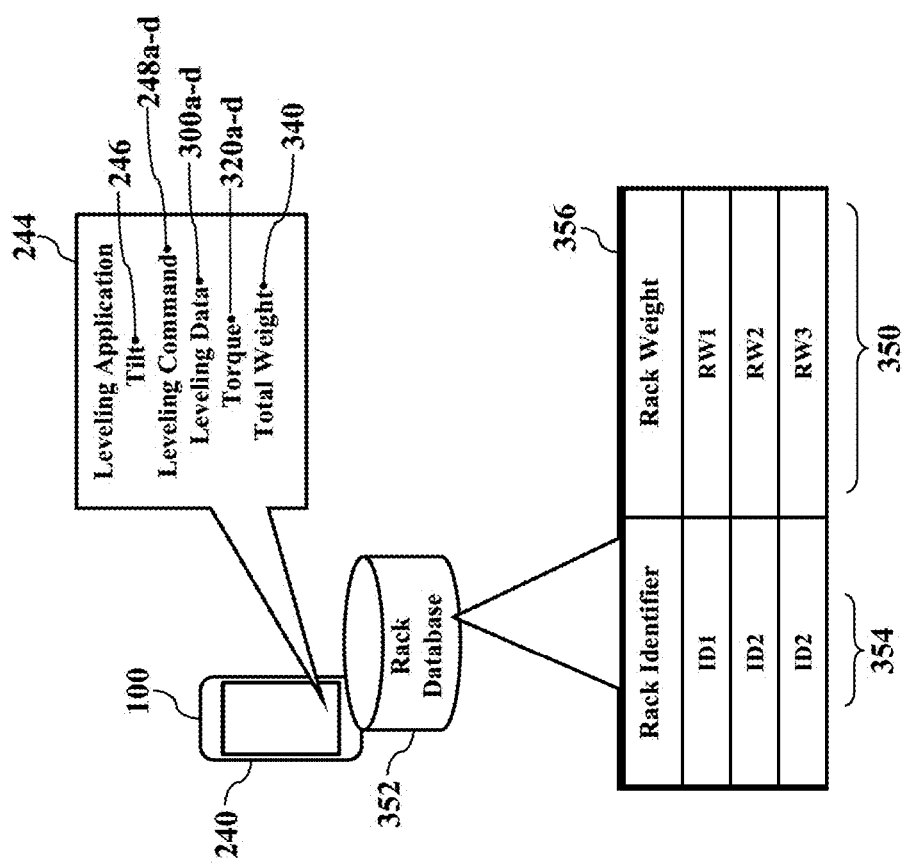

FIG. 12 illustrates a rack weight 350. Now that the total weight 340 is known, exemplary embodiments may determine the rack weight 350 associated with only the equipment rack 202. Recall that the total weight 340 represents the total weight of the equipment rack 202, including the equipment housed or contained within the equipment rack 202. The leveling application 244 may thus identify or determine the contribution due to the equipment rack 202 (illustrated in FIG. 2). An electronic rack database 352, for example, may be queried for a rack identifier 354. The rack identifier 354 may be a model number, serial number, SKU, purchase code, or any other alphanumeric combination that uniquely identifies the equipment rack 202. The rack identifier 354 may be manually entered by a user of the smartphone 240 or the leveling application 244, scanned or read by a bar code reader/application, or sent as a parameter of the leveling data 300. Regardless, FIG. 12 illustrates the electronic rack database 352 as a table 356 having entries that electronically map, relate, or associate different rack identifiers 354 to their corresponding rack weights 350. The electronic rack database 352 may thus be pre-populated or configured with the rack weights 350 that correspond to different rack identifiers 354. The leveling application 244 queries for the rack identifier 354 and identifies and/or retrieves the corresponding rack weight 350.

Figure 13:
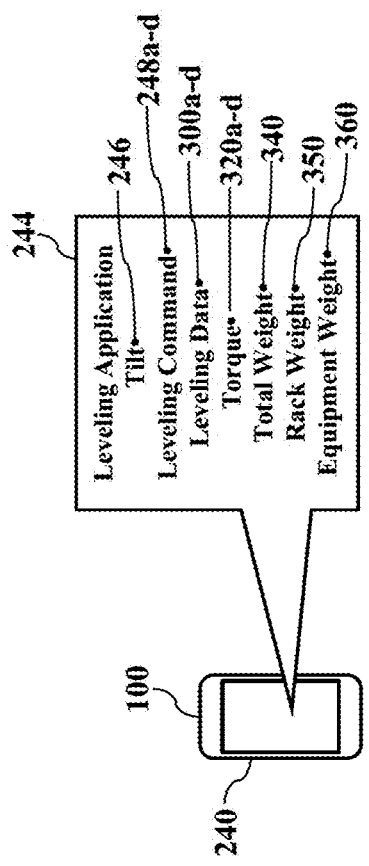

FIG. 13 illustrates an equipment weight 360. Now that the total weight 340 and the rack weight 350 are known, exemplary embodiments may determine the equipment weight 360 representing only the equipment stored or contained within the equipment rack 202. The leveling application 244 need only subtract out the rack weight 350 from the total weight 340 to determine the equipment weight 360.

Figure 14:
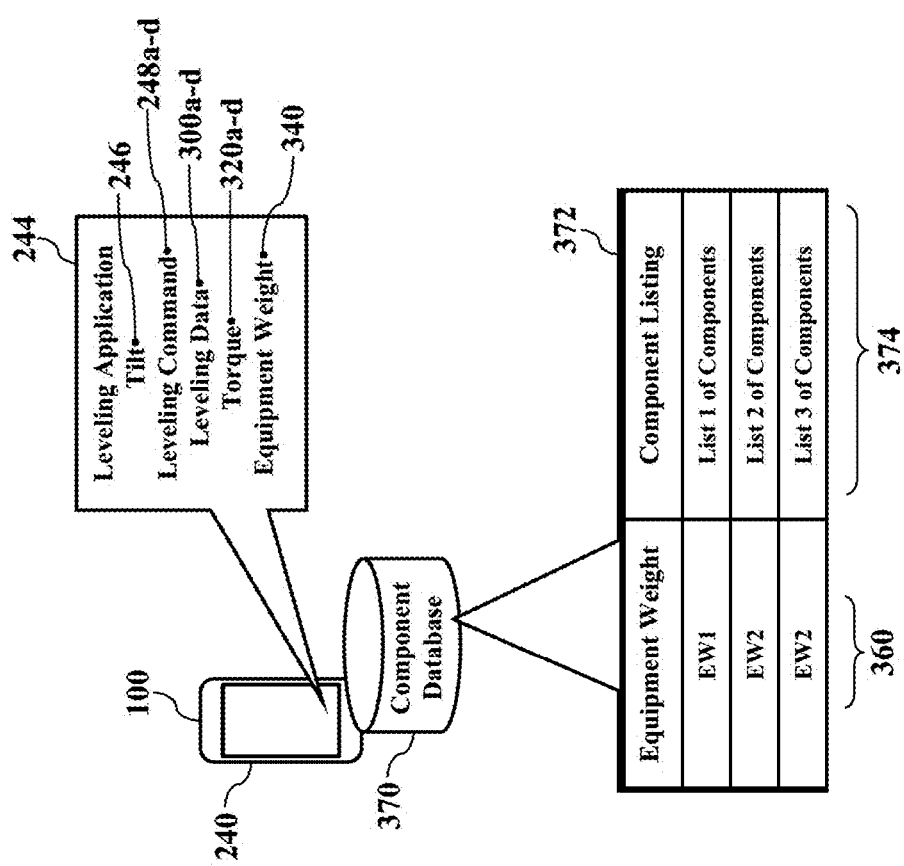

FIG. 14 illustrates rack contents, according to exemplary embodiments. Here exemplary embodiments may determine the equipment stored or contained within the equipment rack 202, based on the equipment weight 360. That is, the leveling application 244 may identify what combination of servers, switches, and other equipment is housed within the equipment rack 202 (illustrated in FIG. 4), based on the equipment weight 360. Indeed, the leveling application 244 may even identify the manufacturers, model numbers, and even serial numbers associated with the equipment housed within the equipment rack 202. As the reader may understand, each component stored within the equipment rack 202 has its own, individual component weight. Each server housed within the equipment rack 202, for example, has its own, specific component weight (in pounds, ounces, kilograms, or even grams). Each switch and each power supply also has its own, specific component weight. The component weight may even differ between models manufactured by the same vendor. In simple words, there will be different combinations of the equipment weight 360, based on the number, manufacturer, and model of the equipment is housed within the equipment rack 202.

An electronic component database 370 may be consulted. Once the equipment weight 360 is determined, the leveling application 244 instructs the smartphone 240 to query the electronic component database 370 for the equipment weight 360 determined from the torques 320 a-d reported by the electronic jacks 230. FIG. 14 illustrates the electronic weight database 342 as a data table 372 that stores or contains entries that electronically associate different values of the equipment weight 360 to its corresponding component listing 374. The component listing 374 identifies the equipment housed within the equipment rack 202, based on their combined equipment weight 360. The electronic weight database 342 thus relates or maps different equipment weights 360 to their possible component listings 374. The electronic weight database 342 may thus be pre-populated or configured with lists of components that correspond to their combined equipment weight 360. The leveling application 244 queries for the equipment weight 360 and identifies or determines the corresponding component listing 374. The leveling application 244 may even retrieve the component listing 374, if needed or desired for other operations or calculations.

Exemplary embodiments may thus identify the equipment stored within the equipment rack 202. Different combinations of servers, switches, and other components may thus be weighed and catalogued as entries in the electronic weight database 342. The component listings 374 may even be specified down to the manufacturer, model, and serial number. Once the equipment weight 360 is known, exemplary embodiments may provide a detailed inventory or contents of the equipment rack 202, even including the serial numbers of the components.

Exemplary embodiments thus leverage the computing power of today's mobile devices. Because the information handling system 100 (such as the mobile device 200 and the smartphone 240) have ample processing, memory, and sensory capabilities, exemplary embodiments relieve personnel of cumbersome leveling of the equipment rack 202. The accelerometer 232, for example, is a device that measures forces of acceleration due to movement and gravity. By measuring the force due to gravity, the accelerometer 232 determines the tilt 246 of the equipment rack 202 relative to the earth ground. The accelerometer 232 may even measure a pressure value being exerted and translate this pressure into useful data, such as the tilt 246. The accelerometer 232 may measure acceleration forces in three dimensions (using springs that are calibrated with a specific weight or mechanical resistance). Even the slightest movement changes the pressure on these springs, which is processes and translated into the tilt 246. Exemplary embodiments may thus preprogram sensory measures that indicate horizontal level or vertical plumb.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A server rack comprising:
    a plurality of supports connected to a bottom base of the server rack;
    at least one equipment shelf connected between at least two of the supports;
    a plurality of adjustable feet threadably engaging the bottom base of the server rack, wherein each adjustable foot of the plurality of adjustable feet is disposed proximate a corresponding generally corner region of the bottom base;
    a plurality of jack bodies protruding upwardly from the bottom base of the server rack, wherein each jack body of the plurality of jack bodies is disposed proximate the corresponding generally corner region of the bottom base, each jack body is longitudinally aligned with a corresponding adjustable foot, and each jack body having a threaded central bore exposing a faceted tip of the corresponding adjustable foot; and
    a plurality of motorized electronic jacks, each motorized electronic jack having a motor driving a socket that mechanically engages the faceted tip of the corresponding adjustable foot;
    wherein an electrical power applied to the motor turns the corresponding adjustable foot to adjust a height of the corresponding generally corner region of the bottom base.

2. The server rack of claim 1, further comprising an aperture in each jack body that longitudinally aligns with the corresponding adjustable foot.

3. The server rack of claim 1, further comprising an aperture in each jack body that exposes the corresponding adjustable foot.

4. The server rack of claim 1, further comprising an aperture in each jack body that exposes a threaded portion of the corresponding adjustable foot.

5. The server rack of claim 1, further comprising a gear box driven by an output shaft of the motor and mechanically connected to the socket.

6. The server rack of claim 1, further comprising an aperture in each jack body through which the corresponding adjustable foot inserts.

7. The server rack of claim 1, further comprising an aperture in each jack body exposing a threaded portion of the corresponding adjustable foot.

* * * * *